United States Patent [19]

Devenish, III

[11] Patent Number: 5,406,455
[45] Date of Patent: Apr. 11, 1995

[54] SNAP-IN CARD GUIDE

[75] Inventor: William R. Devenish, III, Beaverton, Oreg.

[73] Assignee: NEC America, Inc., Melville, N.Y.

[21] Appl. No.: 81,823

[22] Filed: Aug. 16, 1993

[51] Int. Cl.$^6$ .......................... H05K 5/00; H05K 7/14
[52] U.S. Cl. .................................. 361/752; 361/796; 361/801; 174/52.1; 211/41
[58] Field of Search ................. 361/752, 753, 756–757, 361/759, 736–737, 739–741, 747, 796–802; 174/52.1; 211/41

[56] References Cited

U.S. PATENT DOCUMENTS

| | | | |
|---|---|---|---|
| 3,699,393 | 10/1972 | Reimer . | |
| 3,878,438 | 4/1975 | Weisman . | |
| 3,899,721 | 8/1975 | Borchard et al. . | |
| 3,932,016 | 1/1976 | Ammenheuser . | |
| 4,092,699 | 5/1978 | Petrangelo . | |
| 4,327,835 | 5/1982 | Leger . | |
| 4,530,033 | 7/1985 | Meggs . | |
| 4,600,231 | 7/1986 | Sickles | 211/41 |
| 4,664,265 | 5/1987 | George, Jr. | 211/41 |
| 4,672,510 | 6/1987 | Castner | 361/796 |

*Primary Examiner*—Bot LeDynh
*Attorney, Agent, or Firm*—Lane, Aitken & McCann

[57] ABSTRACT

A holder for holding polygonal shaped objects (i.e., printed circuit boards) and adapted to be slidably engaged with a rigid U-shaped enclosure, includes first and second integrally-formed frames and a mechanism for locking the frames into the U-shaped enclosure. The locking mechanism is integrally formed with the frames. A device mounted on the frames receives and holds the rectangular objects. The holder is easily inserted into and removed from the enclosure, allows efficient assembly and disassembly of the holder into and from the enclosure, and reduces the required number of pans and assembly/disassembly time in comparison to conventional holders.

4 Claims, 9 Drawing Sheets

SNAP-IN CARD GUIDE

BACKGROUND OF THE INVENTION

1. Field of the Invention

The present invention generally relates to holders for rectangular-shaped objects such as printed circuit boards (PCBs) or printed circuit cards having electronic components mounted thereon, and more particularly to guides having a "snap lock" mechanism for guiding and holding printed circuit boards or cards therein. The card guide is designed for installation in a card guide enclosure, rack, chassis or other suitable housing to hold the cards in a spaced, parallel array. The "snap-lock" mechanism of the present invention allows a card guide frame to be easily inserted into a rigid U-shaped enclosure and for the cards to be reliably held in the card guide frame.

2. Description of the Related Art

Holders and guides for PCBs are known and are useful for storing and protecting the PCBs. Racks for holding electronic gear have heretofore been relatively complex, have included large numbers of separate parts and fasteners, and have required a great deal of labor to assemble.

For example, as shown in FIG. 8, a conventional card guide includes upper and lower frame portions, each of which includes a plastic frame 61 having at respective ends thereof pairs of legs 62 which are snap-fitted onto a horizontal rail 63 having been previously attached to an enclosure (not shown) via threaded screws 64 and washers 65. A printed circuit card is adapted to be inserted into the guide in a slot formed in the plastic frame. To accommodate the length of the card, typically a pair of frames 61 are arranged horizontally (i.e., on the same plane) on the enclosure surface. Frames 61 are also designed to be used in tandem with a pair of second like frames 61 parallel to the first pair of frames such that the slots of the upper and lower frames oppose each other respectively. Thus, for each plastic card guide a total of four frames are used to guide and hold a printed circuit card. However, the conventional plastic card guide has various problems.

First, the plastic card guide requires a relatively large number of parts, thereby resulting in poor assembly efficiency and increased cost. Indeed, the large number of parts (i.e., washers, screws, etc.) increases the chances of inadvertently leaving some out during assembly or that some of the parts may become lost, and further one or more of the parts may become stripped or loosened during assembly. Further, the plastic card guide has poor reliability in that the plastic card guide has a tendency to break when cards are inserted or removed therefrom at extreme angles. Moreover, during assembly the plastic card guides may be placed in the wrong slot (unless a special fixture is designed and built), in which case the plastic card guides are difficult to remove without breaking. Further, the horizontal rails which hold the plastic card guides are difficult to align, absent a specially manufactured fixture.

Another conventional card guide, as shown in FIG. 9, is a screw-in card guide which includes upper and lower frame portions, each of which includes an integrally formed metal frame 71 having a bottom panel 72 with vertically extending side walls 73 at first and second ends of the bottom panel. Openings 74 are provided for airflow therethrough. The screw-in card guide is fixed to an enclosure (not shown) by screws 76 and washers 77. Clinch-nut fasteners are used to attach (using screws or the like) the card guide to a backplane. Frame 71 is also designed to be used in tandem with a second like frame 71 parallel to the first frame such that the slots of the upper and lower frames oppose each other respectively. Thus, for each screw-in card guide a total of two frames, as well as a plurality of screws, etc., are required for guiding and holding a printed circuit card.

The screw-in card guide has several advantages over the plastic card guide described above. For example, the screw-in card guide requires much less parts than the plastic card guide and therefore assembly time is decreased and assembly efficiency is increased. However, the screw-in card guide still has the problems associated with using screws for assembly, as discussed above.

U.S. Pat. No. 4,530,033 to Meggs discloses yet another conventional card frame for printed circuit cards. The card frame includes molded plastic panels 2 and molded plastic sidewalls 1 adapted to be coupled to the panel. The panel includes U-shaped tenons 21 for insertion into openings 14 in the sidewalls 1 by moving the tenons 21 perpendicularly to the sidewalls and sliding the tenons into place along locating tongues 141 and ridges 142 disposed in the openings. The panel has an elastic tongue 22 for deflection along ramps 15 disposed between pairs of tenons 21 at the ends of the panels. When the panels are slidably positioned (i.e., the elastic tongues snap back to their initial or rest position), the free edges of the elastic tongues abut an end of the ramps to lock the panels onto the sidewalls.

The design of the card frame of U.S. '033 has various problems. For example, the locking mechanism of the card frame of U.S. '033 does not allow a card guide frame to be easily inserted into a rigid U-shaped enclosure. Further, the design of the card frame of U.S. '033 is only for plastic and it would be difficult to use metal for the panels of U.S. '033 because the locking structure of U.S. '033 relies on the relative flexibility and resiliency of the plastic tongues, etc. Further, molding the parts of U.S. '033 from metal in lieu of plastic would be complicated and expensive in terms of the molding process itself, and thus impracticable. Additionally, the system of U.S. '033 requires a plurality of components (i.e., four) for assembly, thereby making assembly cumbersome and time-consuming.

SUMMARY OF THE INVENTION

It is therefore an object of the present invention to provide a card guide which allows a card guide frame to be easily inserted into a rigid U-shaped card guide enclosure.

It is a further object to reduce the number of parts required in providing a card guide which eliminates the need for fasteners, screws, washers and nuts.

A third object is to reduce the assembly time of fitting a card guide into a card guide enclosure.

A fourth object is to improve the reliability of the constructed card guide.

A fifth object is to provide a new and improved card guide and connector assembly which provides firm and rigid support for the printed circuit card.

The above and other objects, features and advantages are achieved in accordance with the first embodiment of the invention by providing a card guide for being inserted into a U-shaped card guide enclosure which includes first and second integrally-formed frames; a mechanism, mounted on respective ones of the first and second frames, for locking the first and second frames into the U-shaped card guide enclosure; and a mechanism for holding the cards, the holding mechanism being mounted on the first and second frames.

The card guide according to the invention is for insertion into the rigid U-shaped enclosure, typically on a shelf in a computer housing or the like. The structure of the present invention provides for ease of assembly, reduces the required number of parts and reduces assembly time in comparison to the conventional card guides, by provision of a snap-lock mechanism which obviates the use of screw, washers, nuts, etc. during assembly/disassembly of the card guide into and from the U-shaped card guide enclosure.

BRIEF DESCRIPTION OF THE DRAWINGS

The foregoing and other objects, aspects and advantages will be better understood from the following detailed description of a preferred embodiment of the invention with reference to the drawings, in which:

FIG. 2(f) is a front sectional view showing a card insertion slot in the top portion of the card guide for receiving a printed circuit card or the like;

FIG. 2(g) is a top view of a portion of the top portion showing a flange portion for insertion into a corresponding slot of a card guide enclosure or the like;

FIG. 3(g) is a front sectional view showing a card insertion slot in the bottom portion of the card guide for receiving a printed circuit card or the like;

DETAILED DESCRIPTION OF A PREFERRED EMBODIMENT OF THE INVENTION

Figure 1:
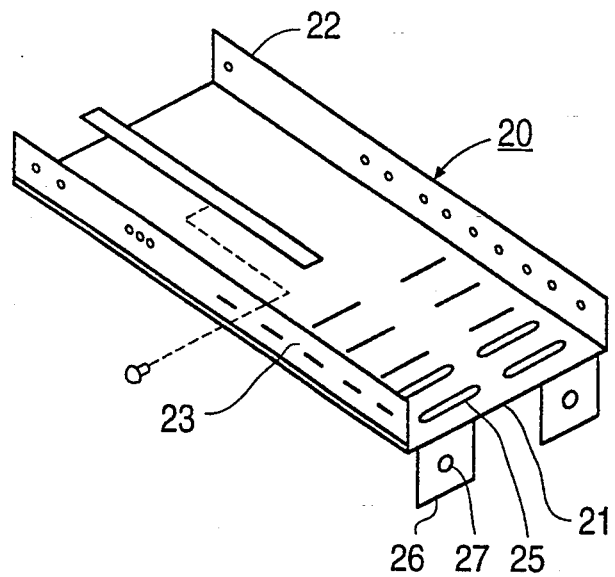
FIG. 1 is a perspective view of an exemplary portion of the card guide according to the present invention.
Figure 8:
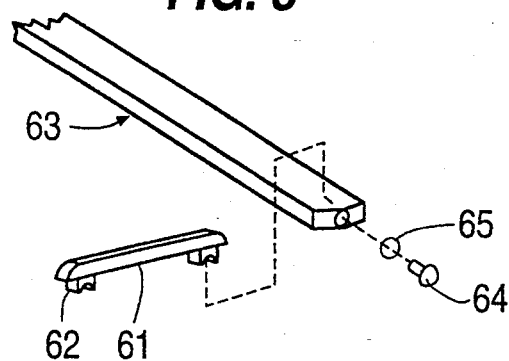
FIG. 8 is a perspective view of a first conventional card guide.
Figure 9:
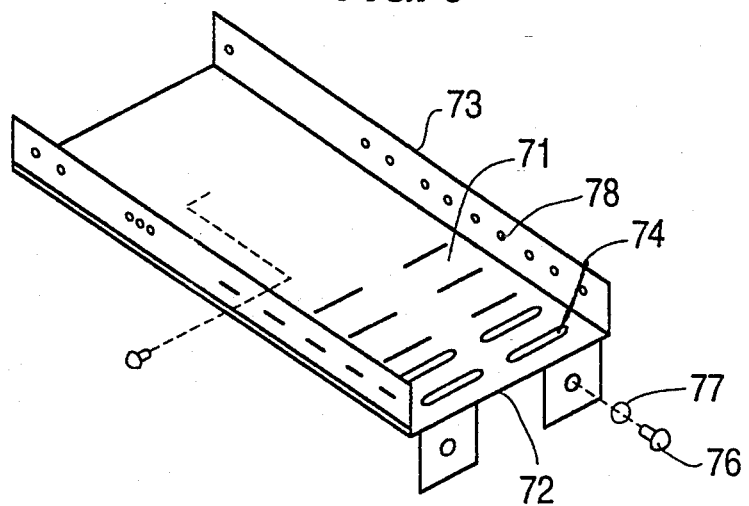
FIG. 9 is a perspective view of a second conventional card guide.

Referring now to the drawings, and more particularly to FIG. 1, there is shown a card guide for guiding and holding printed circuit boards, which includes first (i.e., top) and second (i.e., bottom) portions. For convenience, only the top portion is shown in FIG. 1. The bottom portion has a structure similar to that of the top portion shown in FIG. 1, with minor differences (i.e., in the illustrated embodiment, the bottom portion has snaps on both sidewalls thereof and having tabs at each corner) between the two portions being discussed below. The top and bottom portions of the card guide are discussed in further detail below. The top and bottom portions are preferably used together, in tandem so as to face each other, to hold the cards, and in the illustrated embodiment such a configuration is shown. The top portion is used to guide and hold the top edge surface of the card, whereas the bottom portion of the card guide is used for guiding and holding the bottom edge surface of the printed circuit card.

Referring to FIGS. 2(a) through 2(e), the top portion 20 of the card guide includes a frame having a bottom panel 21 and first and second sidewalls 22, 23 attached to and vertically extending from first and second ends of the bottom panel 21 to form approximately a 90-degree angle therewith.

The frame is preferably integrally formed of metal and more preferably is formed of steel due to its resistance to wear and friction (i.e., grooves being formed) caused by the cards being slidably fitted into slots formed in the card guide frame. However, aluminum or other lightweight durable materials, may also be used if weight of the assembly is a factor to be considered.

Figure 2A:
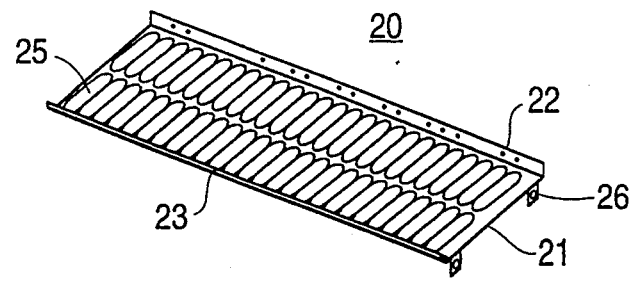
FIG. 2(a) is a perspective view of a top portion of the card guide according to the present invention.
Figure 2B:
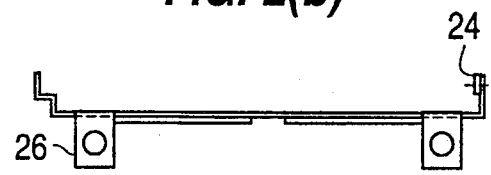
FIG. 2(b) is a side view of the top portion of the card guide according to the present invention.
Figure 2C:
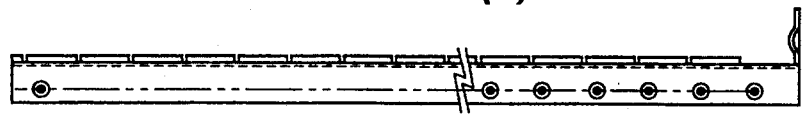
FIG. 2(c) is a rear view of the top portion of the card guide according to the present invention.
Figure 2D:
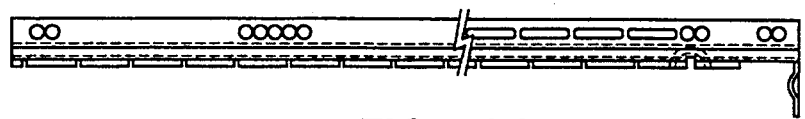
FIG. 2(d) is a front view of the top portion of the card guide according to the present invention.

As shown in FIG. 2(b), a first sidewall of the top portion of the card guide has clinch nuts fasteners 24 which are used to secure a backplane to the rear of the card guide. The individual PCBs slide in the grooves and connect to the backplane (via a fastening member or the like) and thus the printed circuit boards are securably guided and held by the card guide. The second sidewall 23 is substantially S-shaped for accommodation of ejector mechanisms (not illustrated) on the front of selected PCBs. However, the second sidewall may have any shape so long as it does not interfere with the configuration of the cards and peripheral components of the system. FIG. 2(d) shows slots being formed in the one of the sidewalls of the frame for allowing the PCBs to be securely fastened with screws. The slots allow access to the threaded insert located behind the flange (discussed in further detail below) of the sidewall.

Figure 2E:
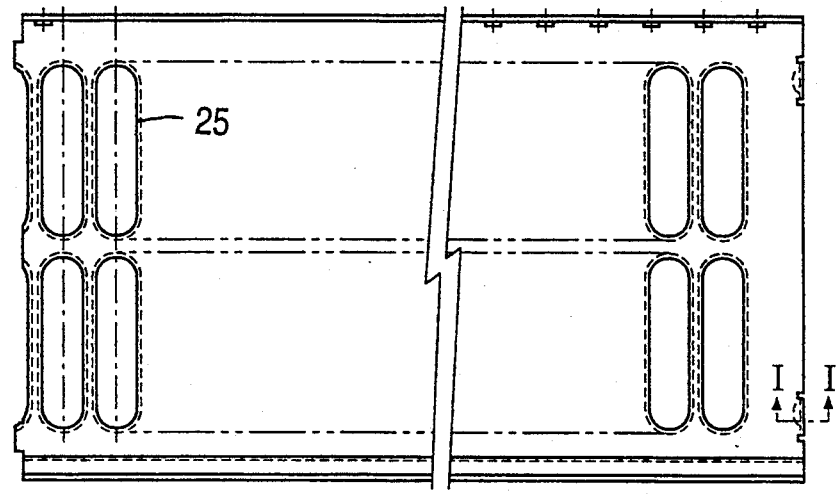
FIG. 2(e) is a top view of the top portion of the card guide according to the present invention.

As best shown in FIGS. 2(a) and 2(e), the frame has a plurality of openings 25 provided therein. The openings may have any shape (i.e., oval, circular, polygonal, etc.) and are utilized for cooling purposes. For example, the openings allow fluid (i.e., pressurized gas, air, etc. from a cooling source or nonpressurized gas, ambient air, etc.) to flow therethrough so as to cool the printed circuit boards or cards adapted to be inserted into the card guide frames and which have mounted thereon hardware components (i.e., CPU, memory modules, etc.) which generate heat.

As shown in FIG. 2(e), the openings 25 are preferably arrayed in a plurality of rows along the length of the frame so that the rows are substantially symmetrical with each other and such that the cards may be fitted on the frame between adjacent openings in a first row and corresponding adjacent openings in a second row. The openings may have any suitable diameter so long as the cards are adequately cooled. For example, in one configuration, with the length of the frame being approximately 20.980 inches in accordance with industry standards and each of the openings having a diameter of approximately 0.586 inches, twenty three cards can be accommodated by the card guide.

Figure 2F:
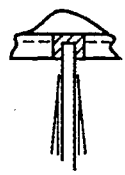

The outer edges of the openings, as shown in greater detail in FIGS. 2(e), 2(d) and 2(f), are beaded to form flanges for guiding and holding the printed circuit boards (i.e., cards) inserted into the card guide. The flanges preferably have a U-shaped cross-section (i.e., a slot) and have a size such that the thickness (e.g., 0.077 in. ±0.005 in) of a desired printed circuit board (i.e., a standard VME card having standard height, depth, and width dimensions) may be reliably engaged herein. However, the flanges can have any shape or thickness so long as the printed circuit boards are reliably held thereby and such that the industry standard for the size of the boards is upheld. The spacing between the cards is preferably approximately 0.8 inches or as required by industry standards and the cards are electrically connectable to the backplane in a manner known in the art and such is believed to be well within the skill of the ordinarily skilled artisan.

Threaded inserts, as shown in FIG. 1, are respectively provided for both the top and bottom portions and are used in the embodiment of the invention simply to adapt the card guide to the preferred architecture (i.e., VME system structure). Specifically, the threaded inserts allow the PCBs to be securely fastened in place. The front of the PCBs have captive screws which align with the inserts. Screws are inserted into the threaded inserts for securing the inserts to the card guide.

However, unlike the conventional screw-in card guides, the card guide according to the present invention requires no screws or washers for its assembly and mounting in a card guide enclosure. Instead, a locking mechanism is formed preferably in the card guide frame (i.e., in the top and/or bottom portion of the card guide itself) and is adapted to engage a portion of the card guide enclosure. As such, assembly and disassembly of the card guide into and from the enclosure is made much easier over that of the conventional systems.

More specifically, the top portion of the frame has a plurality of tabs 26, with each tab having a detent 27. In the embodiment illustrated in FIGS. 2(a)-2(i), two tabs 26 are shown on a first side of the top portion whereas the second side of the top portion includes two tongues 28, i.e., flanges, designed to be engaged with slots formed in the enclosure, as discussed in greater detail below. The tongues 28 allow the PCBs to be closely fitted to the side of the enclosure. The tabs 26 are formed so as to be resilient and specifically are formed to have a thickness which allows the tabs to have a predetermined resilience. The tabs may be formed in some or all of the respective corners of the frame depending upon the system architecture.

Figure 2G:
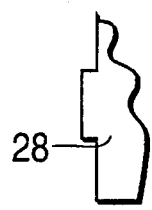
Figure 2I:
FIG. 2(i) is a top view of a portion of the locking mechanism according to the present invention.
Figure 3H:
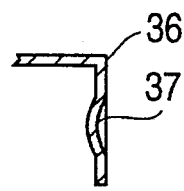
FIG. 3(h) is a front sectional view of a portion of the locking mechanism according to the present invention along the lines II—II shown in FIG. 3(d)
Figure 2H:
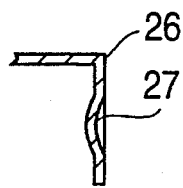
FIG. 2(h) is a front sectional view of a portion of the locking mechanism according to the present invention along the lines I—I shown in FIG. 2(e)

The detents 27 (shown in greater detail in FIGS. 2(h) and 2(i)) on the tabs of the top portion are adapted to engage respective engagement members 48, 49 provided on a portion of a card guide enclosure 41, as shown in FIGS. 4(a)-(i) and 5(a)-(b) and as discussed in further detail below. The detents 27 may have a cross-section having any shape so long as the detents are engageable with the engagement members of the enclosure. In the embodiment illustrated in FIGS. 2(h) and 2(i), the detents preferably have a parabolic cross-section for ease in engaging the engagement members of the enclosure and may have any suitable diameter (e.g., 0.30 inches) and height (e.g., 0.050 inches above the horizontal) so as to securely engage openings formed in the engagement members and to be fitted to the frame. As mentioned above and as shown in FIG. 2(g), the second side of the top portion includes a plurality of tongues 28 designed to be inserted into slots formed in the enclosure.

Referring to FIGS. 3(a)-3(i), the bottom portion 30 of the card guide includes a frame having a bottom panel 31 and first and second sidewalls 32, 33 attached to and vertically extending from first and second ends of the bottom panel. The bottom portion similarly to the top portion described above is also preferably integrally formed of steel. However, aluminum or other lightweight durable materials may also be used as discussed above.

Figure 3G:
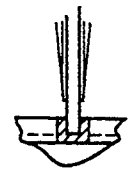
Figure 3I:
FIG. 3(i) is a top view of a portion of the locking mechanism according to the present invention.
Figure 3A:
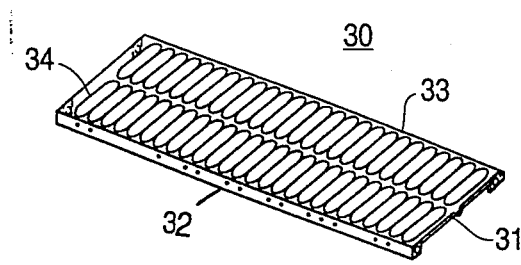
FIG. 3(a) is a perspective view of a bottom portion of the card guide according to the present invention.
Figure 3B:
FIG. 3(b) is a side view of the bottom portion of the card guide according to the present invention.
Figure 3C:
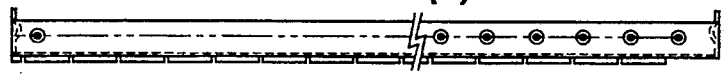
FIG. 3(c) is a rear view of the bottom portion of the card guide according to the present invention.

As shown in FIG. 3(b), a first sidewall of the bottom portion of the card guide has self locking clinch nuts 34 or the like at the upper portion of the sidewall similarly to the top portion described above. The self-locking clinch nuts are used for securing the backplane to the rear of the card guides. The individual PCBs slide in the grooves formed in the bottom portion of the card guide and connect to the backplane. The second sidewall opposes the first sidewall and is substantially S-shaped for accommodation of the ejector mechanisms (not shown) on the front of selected PCBs.

Figure 3D:
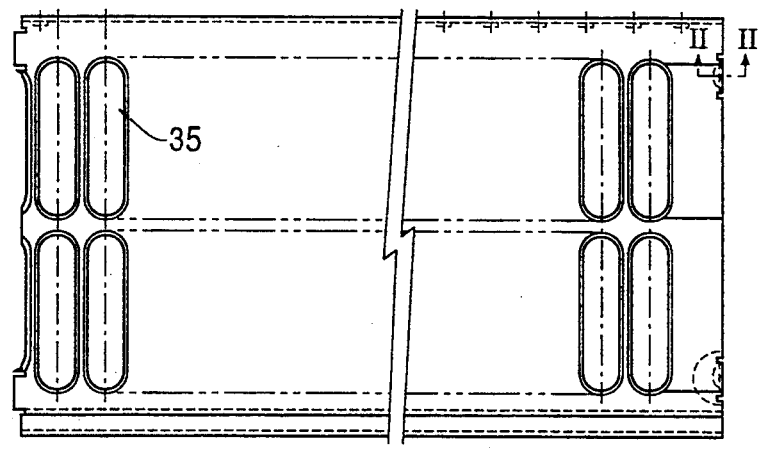
FIG. 3(d) is a top view of the bottom portion of the card guide according to the present invention.

As shown in FIGS. 3(a) and 3(d), the frame has a plurality of openings 35 provided therein. As mentioned above, the openings may have any shape (i.e., oval, circular, polygonal, etc.) and are utilized for cooling purposes. The openings 35 allow fluid to flow therethrough so as to cool the cards received by the card guide frames.

As shown in FIG. 3(d), the openings 35 in the bottom portion similarly to the top portion described above are preferably arrayed in a plurality of rows along the length of the frame but may have any arrangement so long as the rows are substantially symmetrical with each other and such that the cards may be fitted on the frame between adjacent openings in a first row and corresponding adjacent openings in a second row. Further, the openings are formed so as to be symmetrical with the openings in the top portion when the card guide is constructed. The openings may have any suitable diameter so long as the cards are adequately cooled. As mentioned above, twenty three standard VME cards can be accommodated by the card guide.

Figure 3E:
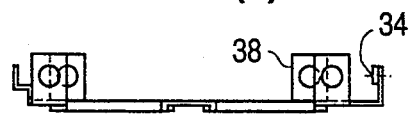
FIG. 3(e) is another side view of the bottom portion of the card guide according to the present invention.
Figure 3F:
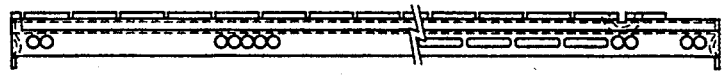
FIG. 3(f) is a front view of the bottom portion of the card guide according to the present invention.

The outer edges of the openings 35, as shown in greater detail in FIGS. 3(e), 3(d) and 3(g), are beaded to form flanges for guiding and holding the printed circuit cards inserted into the card guide. The flanges preferably form a slot having a U-shaped cross-section and have a size such that the thickness of a desired (i.e., a standard VME card) printed circuit board may be reliably engaged therein. However, the flanges can have any shape or thickness so long as the printed circuit boards are reliably held thereby and such that the industry standard for the size of the boards is met. The spacing between the cards is the same as the top portion of the card guide.

As mentioned above, unlike the conventional screw-in card guides, the present invention requires no screws or washers for its assembly and mounting in a card guide enclosure. Instead, a locking mechanism is formed preferably in the card guide frame (i.e., in the top portion as described above and in the bottom portion as discussed below) and is adapted to engage a portion of the card guide enclosure. As such, assembly and disassembly of the card guide into and from the enclosure is made much easier over that of the conventional systems.

More specifically, the frame of the bottom portion has a plurality of tabs 36 (i.e., in the embodiment illustrated in FIG. 3(a), four tabs are shown), with each tab having a detent 37. The tabs 36 on a first side of the bottom portion (i.e., as shown in FIG. 3(b)) may be offset from the tabs on a second side of the bottom portion depending on the configuration of the enclosure 40. In the present embodiment, the tabs are constructed to be offset from one another to fit around various parts in the enclosure (i.e., fans, connectors, wires, etc.). Depending upon the environment of the enclosure and the peripheral components housed therein, the tabs may not have to be offset.

The tabs 36 are formed so as to be resilient similarly to the tabs 26 of the top portion and may be formed in some or all of the respective corners of the frame. The detents 37 (shown in greater detail in FIGS. 3(h) and 3(i)) on the tabs of the bottom portion are adapted to snap into respective engagement members provided in a portion of the card guide enclosure, as shown in FIGS. 4(a)-4(i) and 5(a)-5(b). Similarly to the detents in the top portion of the card guide, the detents may have a cross-section having any shape and dimensions so long as the detents are engageable with the engagement members formed in the enclosure.

Another difference between the top and bottom portions is that the U-shaped grooves face each other and that the detents are downwardly bent.

The card guide enclosure 41 shown in FIGS. 4(a)-4(i) is for receiving and securably engaging the card guide formed by the top and bottom portions described above. The card guide enclosure is preferably U-shaped because it reduces the number of parts required. The enclosure is preferably constructed of metal, and more preferably of steel. By having the enclosure (as well as the top and bottom frame portions of the card guide) formed of metal, the holder assembly provides a shielding and grounding capability which is advantageous in computer architecture. In contrast, plastic systems are unable to provide such features, absent costly processings such as depositing metal coatings over the plastic or utilizing special polymers employing plastic and metal components therein.

The dimensions of the card guide enclosure are sufficient to engage the respective top and bottom portions of the card guide. The card guide enclosure includes flanges 42, 42' respectively securable by welding or the like to first and second sidewalls 43, 43' of the enclosure. The flanges are used for connection of the completed structure (i.e., shown in FIG. 7) including the card guide and enclosure therein, to a larger system rack or the like.

Figure 4A:
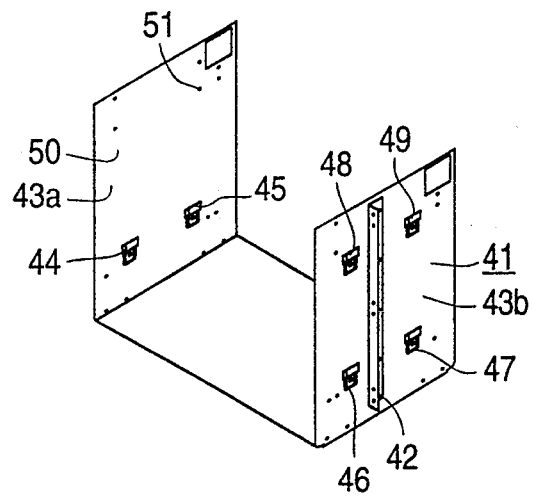
FIG. 4(a) is a perspective view of a U-shaped enclosure adapted to accommodate the top and bottom portions of the card guide according to the invention.
Figure 4C:
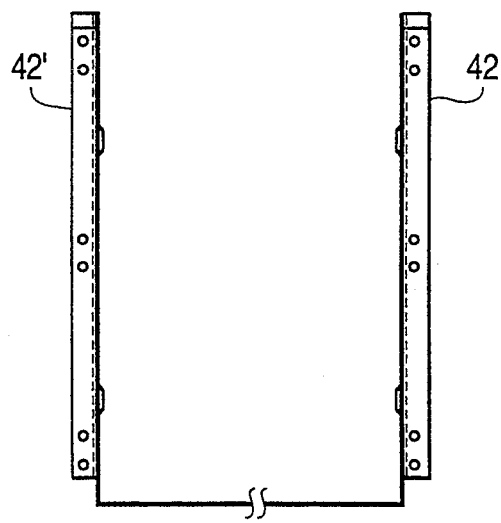
FIG. 4(c) is a front view of the U-shaped enclosure of FIG. 4(a)

As shown in FIG. 4(a), the first sidewall 43a includes two engagement members 44, 45 for receiving respective first and second tabs on a first end of the bottom portion of the card guide and for thereby securing the first end of the bottom portion of card guide. The second sidewall 43b includes four engagement members 46, 47, 48 and 49 formed therein. As discussed in greater detail below, the engagement members include a structure having a unique configuration to include openings formed in the U-shaped enclosure. Engagement members 46, 47 are formed on a plane relatively near the bottom of the enclosure and on a same plane as that on which the two engagement members 44, 45 on the first sidewall 43a are formed. Such a configuration allows the bottom portion of the card guide to be relatively level (i.e., parallel) with regard to a surface on which the enclosure is placed. Preferably, the bottom portion of the card guide makes a 90-degree angle with respect to the sidewalls of the enclosure. The third and fourth engagement members 48, 49 formed on the second sidewall 43b are formed relatively near the top of the sidewall (i.e., nearer to the opening between the sidewalls of the U-shaped enclosure) on a plane. Slots 50, 51 are formed in the sidewall 43a in positions relatively near the top of the sidewall and on the same plane with engagement members 48, 49. The slots are for receiving the tongues 28 of the top portion of the card guide. Such a configuration allows the top portion of the card guide to be relatively level with regard to a surface on which the enclosure is placed. Preferably, the top portion of the card guide when seated in the U-shaped enclosure makes a 90-degree angle with respect to the sidewalls of the enclosure.

Figure 4B:
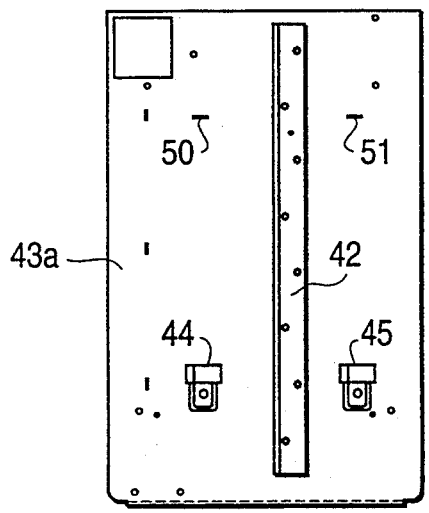
FIG. 4(b) is a side view of the U-shaped enclosure of FIG. 4(a)
Figure 4D:
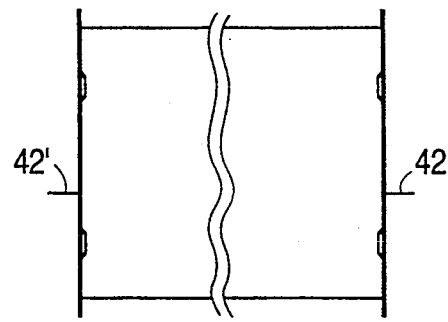
FIG. 4(d) is a top view of the U-shaped enclosure of FIG. 4(a)
Figure 4E:
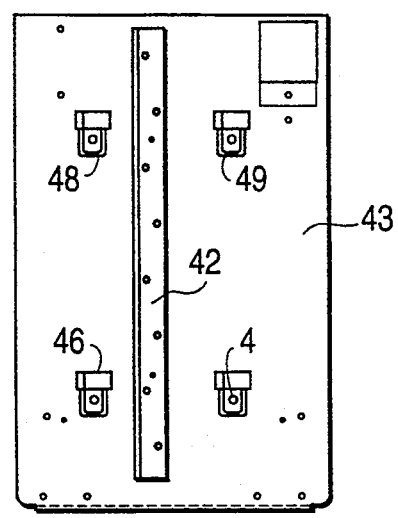
FIG. 4(e) is another side view of the U-shaped enclosure of FIG. 4(a)

As shown in FIG. 4(b), the enclosure 41 includes a cut-out portion on each sidewall. The cutout is preferably used for appropriate cable routing (i.e., power, ground, etc.).

Figure 4G:
FIG. 4(g) is a top sectional view along lines III—III of the engagement member of FIG. 4(f)
Figure 4F:
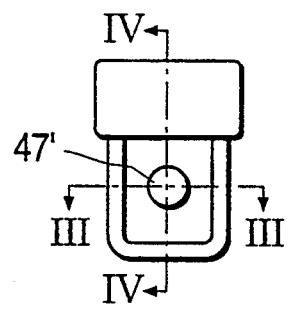
FIG. 4(f) is a view of one of the engagement members formed on the U-shaped enclosure shown in FIG. 4(a)
Figure 4H:
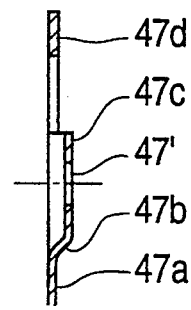
FIG. 4(h) is another side sectional view along lines IV—IV of the engagement member of the U-shaped enclosure shown in FIG. 4(g)

Looking at the engagement members formed on the U-shaped enclosure in greater detail, FIGS. 4(g)-4(i) illustrate the engagement member 47, which has a structure which is representative of all of the engagement members. Engagement member 47 is integrally formed with the sidewall 43b of the enclosure and includes an opening 47'. The engagement member has four portions (i.e., portions 47a-47d) formed appropriately on the enclosure (i.e, in this case, engagement member 47 is formed in the bottom portion of the enclosure). The first portion 47a and the third portion 47c of the engagement member are coupled together by an intermediate second portion 47b such that the third portion is slightly displaced (i.e., indented) towards the interior of the enclosure to thereby form a tongue or the like for receiving the respective tab formed on the card guide. The third portion 47c includes the opening 47' formed therein. A fourth portion 47d of the engagement member is separated from the third potion 47c by a suitable space so as to allow the respective tab to be inserted through the space for engagement by the engagement member. The fourth portion 47d is formed on the same plane as that of the first portion 47a. Thus, portions 47c and 47d are slightly offset from one another by a suitable space so as to allow the tabs to be inserted therebetween and to allow the detents on the tabs to engage opening 47' and thereby provide the snap-fit locking feature of the invention. Thus, opening 47' is for receiving the respective detent formed on the tabs of the bottom and top portions of the card guide.

The operation of fitting the card guide into the card guide enclosure will be described hereinafter. Generally, assembling and fitting the card guide into the card guide enclosure, as well as disassembly and removal of the card guide from the card guide enclosure, is simply and easily performed. No special tools or fasteners are required.

To assemble the card guide and enclosure, the top and bottom portions of the card guide are assembled and inserted into the enclosure and thereafter the PCBs are inserted into the corresponding grooves in the top and bottom portions.

Specifically, the bottom portion of the card guide frame is fitted over the enclosure and is slidably and downwardly moved into the enclosure such that the tabs of the bottom portion are positioned adjacent to the engagement members. The bottom portion is further moved downwardly until the tabs are inserted between the space formed between the third and fourth portions of each of the engagement members. The tabs, and more specifically the detents on the tabs, are adjacent (i.e., slightly above the openings formed in the respective engagement members) the openings in the engagement members such that the detents on the respective tabs contact the circumferential surface of the enclosure surrounding the openings.

Figure 5A:
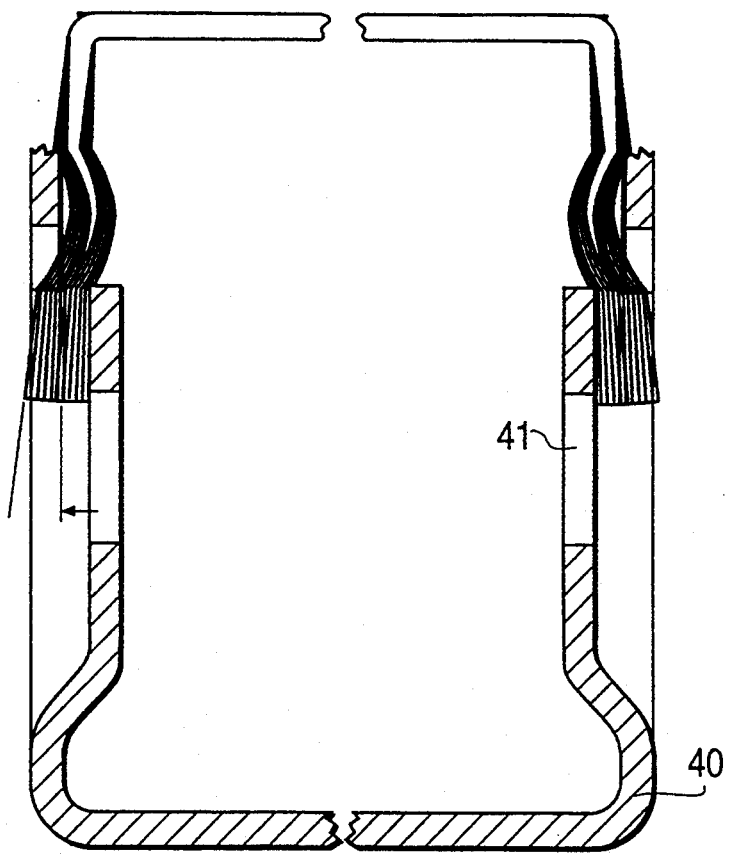
FIG. 5(a) is a view illustrating the card guide of the present invention being inserted into a card guide enclosure.
Figure 5B:
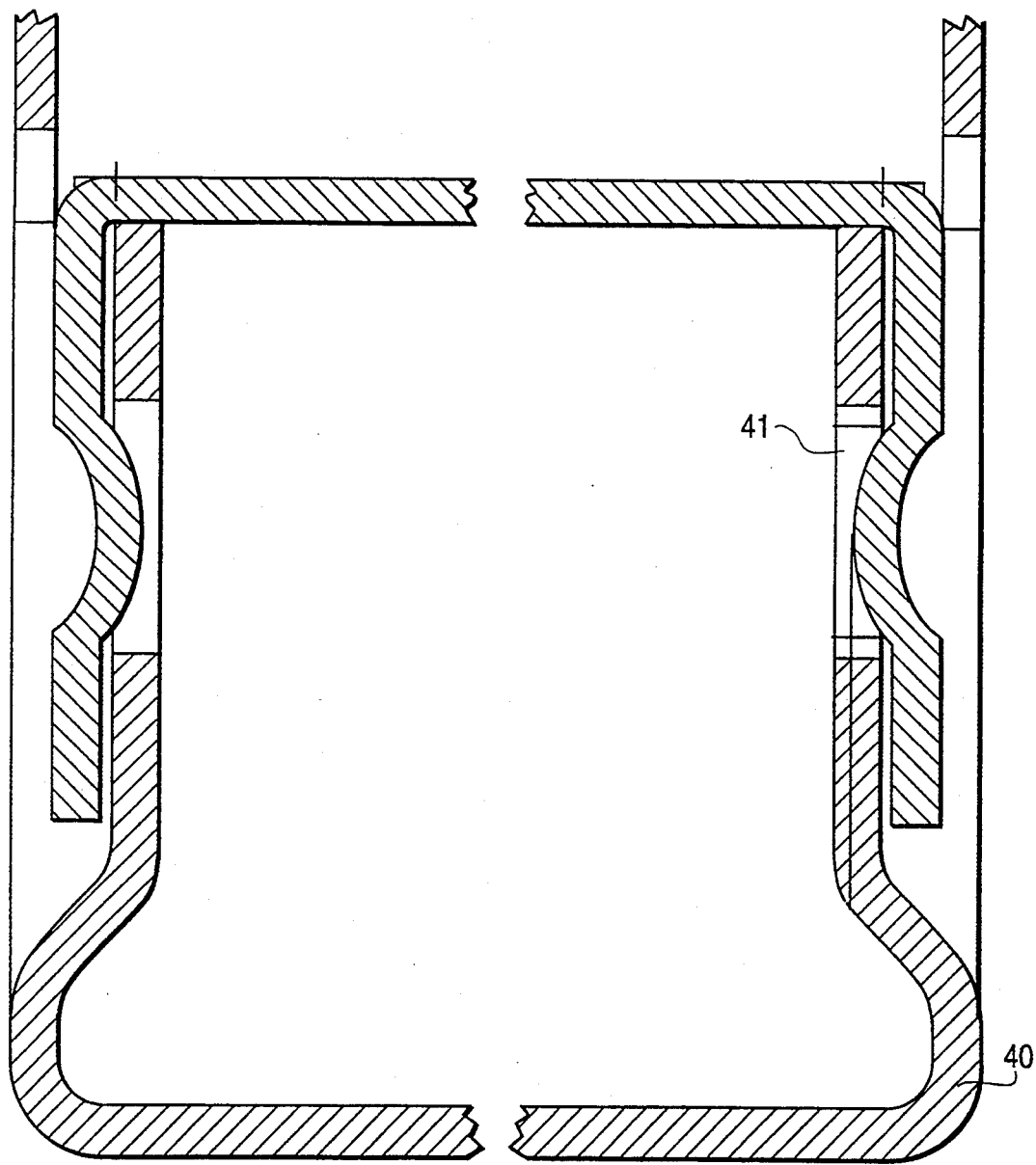
FIG. 5(b) is a view illustrating the card guide of the present invention having been inserted into a card guide enclosure.

As shown in FIG. 5(a), the operator then exerts a compressive force on the enclosure and/or bottom portion of the card guide frame such that the detents of the tabs are slidably engaged by the surface of the enclosure until the detents are forcibly inserted into the openings of the engagement members. As a result, the bottom portion of the card guide frame is securably retained in the enclosure, as shown for example in FIG. 5(b).

Similarly, the top portion of the card guide frame is inserted into the upper portion of the U-shaped enclosure. Specifically, the tongues 28 formed on one end of the top portion of the card guide are slidably inserted into the respective slots 50, 51 on the top portion of the sidewall 43a of the enclosure. Thereafter, the tabs on a second end of the top portion of the card guide are inserted between respective spaces or openings formed between the third and fourth portions of the appropriate engagement members on the upper portion of the sidewall 43b. Similarly to the bottom portion described above, the operator exerts a compressive force on the frame and/or respective portion of the card guide frame such that the detents of the tabs are slidably engaged by the surface of the enclosure until the detents are forcibly inserted into the openings of the enclosure, thereby to securely and reliably retain the top portion of the card guide frame in the enclosure.

Thereafter, the desired number of printed circuit cards are inserted into place into the respective corresponding grooves in the top and bottom portions of the card guide. The cards are securely fastened to the structure after both the top and bottom portions of the card guide have been assembled and inserted into the U-shaped enclosure.

Figure 6:
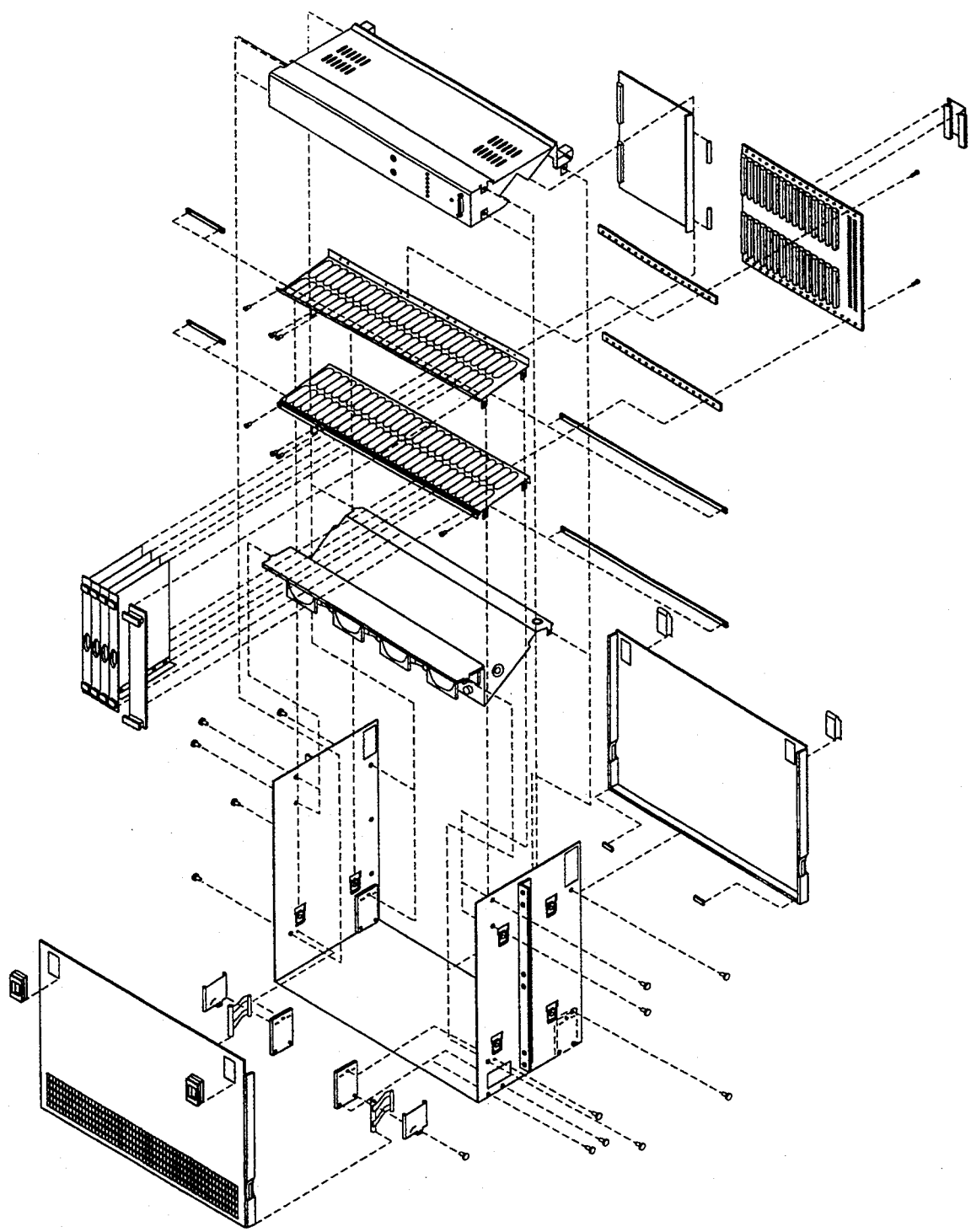
FIG. 6 is an exploded perspective view of a preferred assembly of the card guide into the U-shaped enclosure according to the invention.
Figure 7:
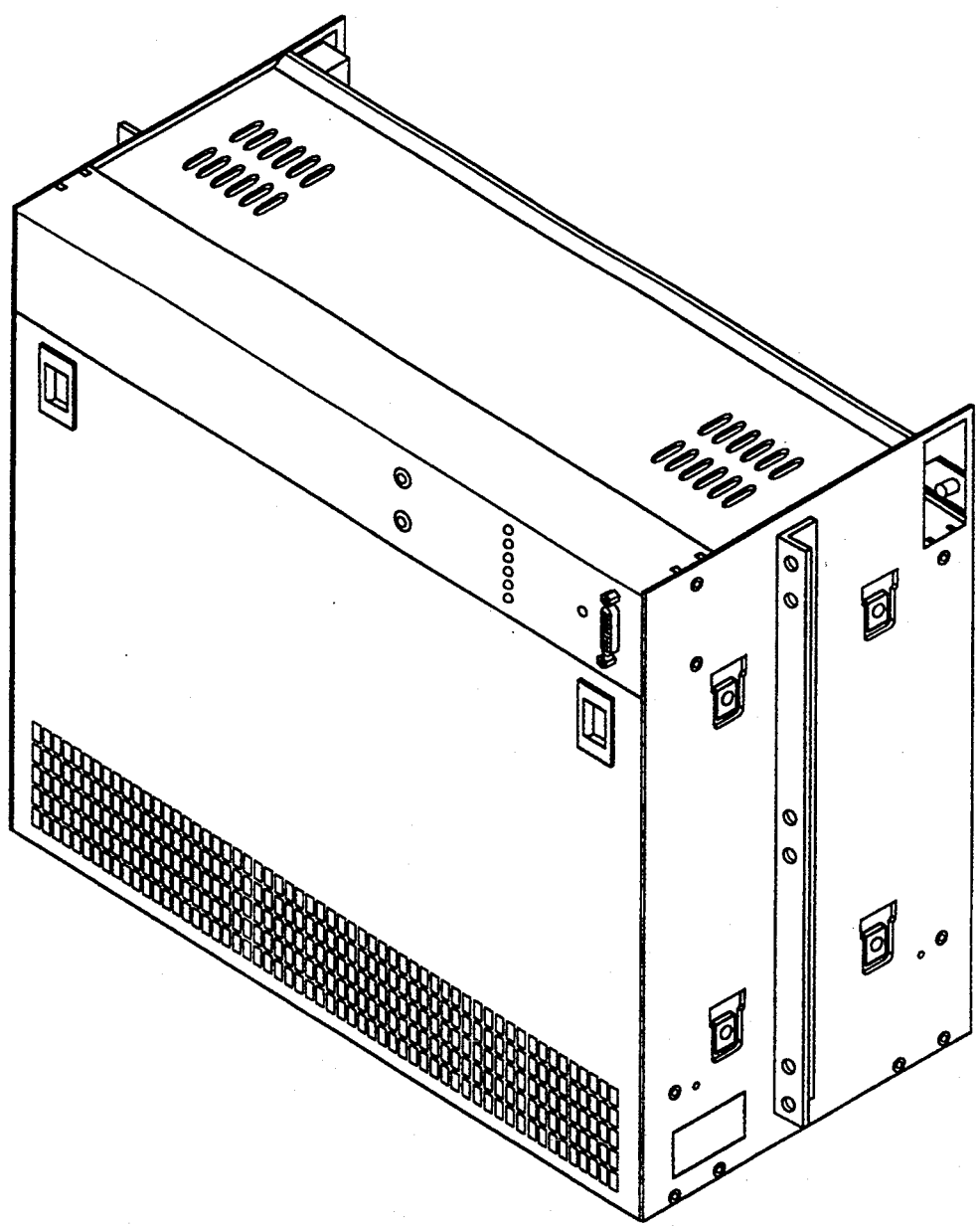
FIG. 7 is a perspective view showing the completed preferred assembly in which the card guide is assembled into the U-shaped enclosure of FIG. 6.

Thereafter, the top cover of the assembly is secured in place with screws. The top cover keeps the assembly together and provides the requisite amount of rigidity. Once the entire chassis has been assembled, it can be placed into a rack as part of a system. While well beyond the scope of this invention, an exploded view illustrating an assembly/disassembly of a preferred chassis assembly utilizing the inventive card guide and U-shaped enclosure as well as other peripheral components (i.e., fans, bottom plate, backplane, front plate, top cover, etc.) is shown in FIG. 6. FIG. 6 illustrates the relative ease of assembly provided by the snap-in card guide into the U-shaped enclosure of the invention which requires no screws or the like in securing the card guide to the enclosure. A completed assembly is shown in FIG. 7.

Disassembly is also made easy with the structure of the present invention, with the operator unfastening and removing the top cover of the assembly and removing the printed circuit cards from the top and bottom portions of the card guide. Thereafter, free ends of the tabs of the respective top and bottom portions are pulled outwardly to extricate the detent from the respective openings in the engagement members of the enclosure. Then, the operator pulls the enclosure and/or card guide frame in the appropriate direction, thereby to quickly and efficiently disassemble the card guide from the enclosure. Alternatively, due to the resilience of the tabs, exerting pressure on the tabs from below (i.e., upwardly from a position under the respective top or bottom frame) will cause the tabs to flex outwardly as the detents slide against the upper portions of the openings, thereby snapping the detents out of the openings to be disengaged from the engagement members.

Generally, the card guide discussed above has been designed for use in the VME architecture. However, it is contemplated that the card guide and U-shaped enclosure can be easily modified or otherwise fitted into a number of different operating systems and architectures.

The embodiment according to the present invention provides a card guide for reliably holding printed circuit boards, cards or the like, and which can be easily inserted in a rigid U-shaped enclosure without the use of screws or the like. The structure of the present invention provides for easy assembly and disassembly of the card guide into and from the card guide enclosure, reduces the required number of parts and reduces assembly time in comparison to other conventional card guides.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A printed circuit card holder assembly for holding a plurality of printed circuit cards, said assembly comprising in combination;
   - a rigid, U-shaped, metal enclosure having a bottom wall and two facing, parallel side walls;
   - a metal frame member extending between said two facing, parallel side walls, said metal frame member including two resilient tabs extending downwardly from one end of said metal frame member;
   - one of said two side walls having two small regions therein formed respectively into two inwardly extending, upstanding support members; and
   - said two resilient tabs inserted from above into said two inwardly extending, upstanding support members.

2. A printed circuit card holder assembly as in claim 1, further including a detent formed in each of said tabs and a hole in each of said upstanding support members, said detent in each of said tabs respectively nested in said hole in each of said upstanding support members.

3. A printed circuit card holder assembly as in claim 1, wherein said metal frame member includes two resilient tabs extending downwardly from said other end of said metal frame member and said other of said two side walls has two small regions therein respectively formed into two inwardly extending upstanding support members and said two resilient tabs extending downwardly from said other end of said metal frame member are inserted from above into said two inwardly extending upstanding support members formed in said other of said two side walls.

4. A printed circuit card holder assembly as in claim 3, further including a detent formed in each of said tabs and a hole in each of said upstanding support members, said detent in each of said tabs respectively nested in said hole in each of said upstanding support members.

* * * * *